US012768879B2

(12) United States Patent
Liu et al.

(10) Patent No.: US 12,768,879 B2
(45) Date of Patent: Oct. 20, 2026

(54) THERMAL MEASUREMENT FOR COMPLEX THERMAL STACK UP PRODUCTS

(71) Applicant: NVIDIA Corporation, Santa Clara, CA (US)

(72) Inventors: Celing Liu, Morgan Hill, CA (US); Gunaseelan Ponnuvel, San Jose, CA (US)

(73) Assignee: NVIDIA Corporation, Santa Clara, CA (US)

( * ) Notice: Subject to any disclaimer, the term of this patent is extended or adjusted under 35 U.S.C. 154(b) by 61 days.

(21) Appl. No.: 18/734,859

(22) Filed: Jun. 5, 2024

(65) Prior Publication Data

US 2025/0377404 A1 Dec. 11, 2025

(51) Int. Cl.
*G01R 31/28* (2006.01)

(52) U.S. Cl.
CPC ..... *G01R 31/2874* (2013.01); *G01R 31/2889* (2013.01); *G01R 31/2891* (2013.01)

(58) Field of Classification Search
CPC ............ G01R 31/2874; G01R 31/2889; G01R 31/2891
USPC ......................... 324/500, 600, 76.11, 750.03
See application file for complete search history.

(56) References Cited

U.S. PATENT DOCUMENTS 10,475,752 B2 * 11/2019 Hsu ..................... H10W 42/121
10,943,882 B1 3/2021 Chipalkatti et al.
11,374,136 B2 * 6/2022 Tai ......................... H10F 71/139
11,450,622 B2 * 9/2022 Wang .................. H10W 40/228
12,009,317 B2 * 6/2024 Yen ........................ H10W 40/77
12,298,825 B2 5/2025 Lin et al.
2004/0112142 A1 * 6/2004 Min ................... G01R 31/2893 73/818
2009/0286353 A1 * 11/2009 Tosi ..................... G01R 31/311 438/106
2011/0267082 A1 * 11/2011 Fregeau ................. G01K 13/00 324/750.05
2014/0159758 A1 * 6/2014 Bhatt ................... G01R 31/311 324/754.08
2015/0303171 A1 * 10/2015 Patten ................. H01L 21/6835 156/297
2017/0285700 A1 * 10/2017 Cartagena ............... G06F 1/206
2021/0294398 A1 * 9/2021 Jain ................ G01R 31/318533
2023/0064442 A1 * 3/2023 Kan .................... H10W 40/226
(Continued)

*Primary Examiner* — Huy Q Phan
*Assistant Examiner* — Trung Q Nguyen

(57) ABSTRACT

Testing chip or board packages for thermal failure can be conducted at various stages of the package's life cycle. Conventional testing can detect a thermal failure of the package, though conventional testing does not detect at which specific thermal layer a failure has occurred. By applying an R deviation percentage to the measured thermal parameters received from a testing unit, a specific breakdown of each thermal interface layer can be analyzed. Each thermal interface layer has an associated gold value which is a known good value of thermal energy at a specific time interval. The gold value can be compared to the timing results calculated from the measured thermal parameters. This comparison can then identify which thermal interface layers, if any, are causing the thermal failure of the package. The thermal interface layer can then be repaired or the manufacturing process can be modified to eliminate the failure.

20 Claims, 6 Drawing Sheets

(56) References Cited

U.S. PATENT DOCUMENTS

| | | | |
|---|---|---|---|
| 2024/0222221 | A1 | 7/2024 | Jain et al. |
| 2026/0119186 | A1 | 4/2026 | Yang et al. |

* cited by examiner

THERMAL MEASUREMENT FOR COMPLEX THERMAL STACK UP PRODUCTS

TECHNICAL FIELD

This application is directed, in general, to semiconductor testing and, more specifically, to thermal measurements of a chip package.

BACKGROUND

Testing semiconductors, such as integrated circuits or systems on a chip, can be time-consuming and complex, especially as semiconductors become more complex and tightly packed with components. Thermal resistance is one key parameter that can be measured during testing. A problem can occur in diagnosing when a thermal resistance issue is discovered, meaning, was this a manufacturing environment issue, a testing issue, an operator issue, or an issue with the thermal handling within the chip package itself. Better diagnosing of the thermal measurement issues can improve the quality of chips being manufactured and then shipped to customers.

SUMMARY

In one aspect, a method is disclosed. In one embodiment, the method includes (1) determining an R deviation percentage threshold for each thermal interface layer in a set of thermal interface layers, wherein the set of thermal interface layers is part of a chip package or a board package undergoing a thermal test, (2) calculating an R deviation for each thermal interface layer in the set of thermal interface layers using the R deviation percentage threshold, (3) determining a measured time parameter from the R deviation and thermal measurements from the chip package or the board package for each thermal interface layer in the set of thermal interface layers, (4) identifying a thermal failure parameter for each thermal interface layer in the set of thermal interface layers by comparing the measured time parameter to a thermal interface layer gold value for each thermal interface layer, and (5) communicating the thermal failure parameter for each thermal interface layer in the set of thermal interface layers as a set of thermal failure parameters.

In a second aspect, a system is disclosed. In one embodiment, the system includes (1) a receiver, operational to receive input parameters and input measurements from thermal testing of a chip package or a board package, and (2) a thermal analyzer, implemented on one or more processors, and operational to determine an R deviation percentage threshold for each thermal interface layer in a set of thermal interface layers, calculate an R deviation for each thermal interface layer using the R deviation percentage threshold, determine a measured time parameter from the R deviation and the input measurements from the thermal testing for each thermal interface layer, identify a thermal failure parameter for each thermal interface layer by comparing the measured time parameter to a thermal interface layer gold value, and communicating the thermal failure parameter for each thermal interface layer as a set of thermal failure parameters.

In a third aspect, a computer program product having a series of operating instructions stored on a non-transitory computer-readable medium that directs a data processing apparatus when executed thereby to perform operations to identify a set of thermal failure parameters is disclosed. In one embodiment, the operations include (1) determining an R deviation percentage threshold for each thermal interface layer in a set of thermal interface layers, wherein the set of thermal interface layers is part of a chip package or a board package undergoing a thermal test, (2) calculating an R deviation for each thermal interface layer in the set of thermal interface layers using the R deviation percentage threshold, (3) determining a measured time parameter from the R deviation and thermal measurements from the chip package or the board package for each thermal interface layer in the set of thermal interface layers, (4) identifying a thermal failure parameter for each thermal interface layer in the set of thermal interface layers by comparing the measured time parameter to a thermal interface layer gold value for each thermal interface layer in the set of thermal interface layers, and (5) communicating the thermal failure parameter for each thermal interface layer in the set of thermal interface layers as the set of thermal failure parameters.

BRIEF DESCRIPTION

Reference is now made to the following descriptions taken in conjunction with the accompanying drawings, in which.

DETAILED DESCRIPTION

The process of manufacturing a chip package encompasses many steps. After the semiconductor, such as an integrated circuit (IC) or system on a chip (SoC) is manufactured, the semiconductor (e.g., chip) can be combined into a chip package. The chip package can include two or more components, such as other chips, thermal interfaces, liquid cooling system, chassis, support brackets, fasteners (such as screws), heat spreaders, glues, paste, or other components.

Thermal resistance is one key parameter that can be measured. When there is a problem with the thermal resistance, typically when the thermal measurements are too high compared to a desired thermal threshold, the problem area should be identified so corrective action can be taken. The thermal issue can occur in the manufacturing area (such as imprecise manufacturing), with the testing environment (such as the testing environment not replicating real-world environments), with an operator (such as not measuring the thermal resistance properly), or with the chip package (such as a thermal layer not being thick enough or incorrectly applied). Significant resources can be expended in analyzing the chip package when determining where the failure point occurred. Once a chip package has been shipped to a customer, and the customer reports a thermal over-temperature issue, it is difficult to remotely analyze the chip package to determine where the failure point has occurred.

This disclosure presents processes to improve the ability to analyze thermal issues occurring in a chip package. Various types of thermal resistance measurement methods can be used. The thermal resistance measurements can utilize conventional thermal testing combined with measurement parameters from the timing domain (Thermal Resistance Domain). The disclosure utilizes the thermal dissipation process that the thermal path from the heat source will have different timings when passing through different thermal interfaces. In some aspects, the collected results from the thermal dissipation process can be compared to a known good system where the thermal dissipation timings are compared to improve the ability to isolate the thermal failure to a specific thermal interface layer (TIM).

The result of the analysis of the thermal resistance measurement can assist in narrowing down the thermal interface layers that may be causing the thermal failure to improve the response time of correcting the manufacturing process. The disclosed methods can also improve the chip package yields from the manufacturing process. By being able to pinpoint which thermal interface layer is causing the thermal issue, customer satisfaction can be improved.

Figure 1:
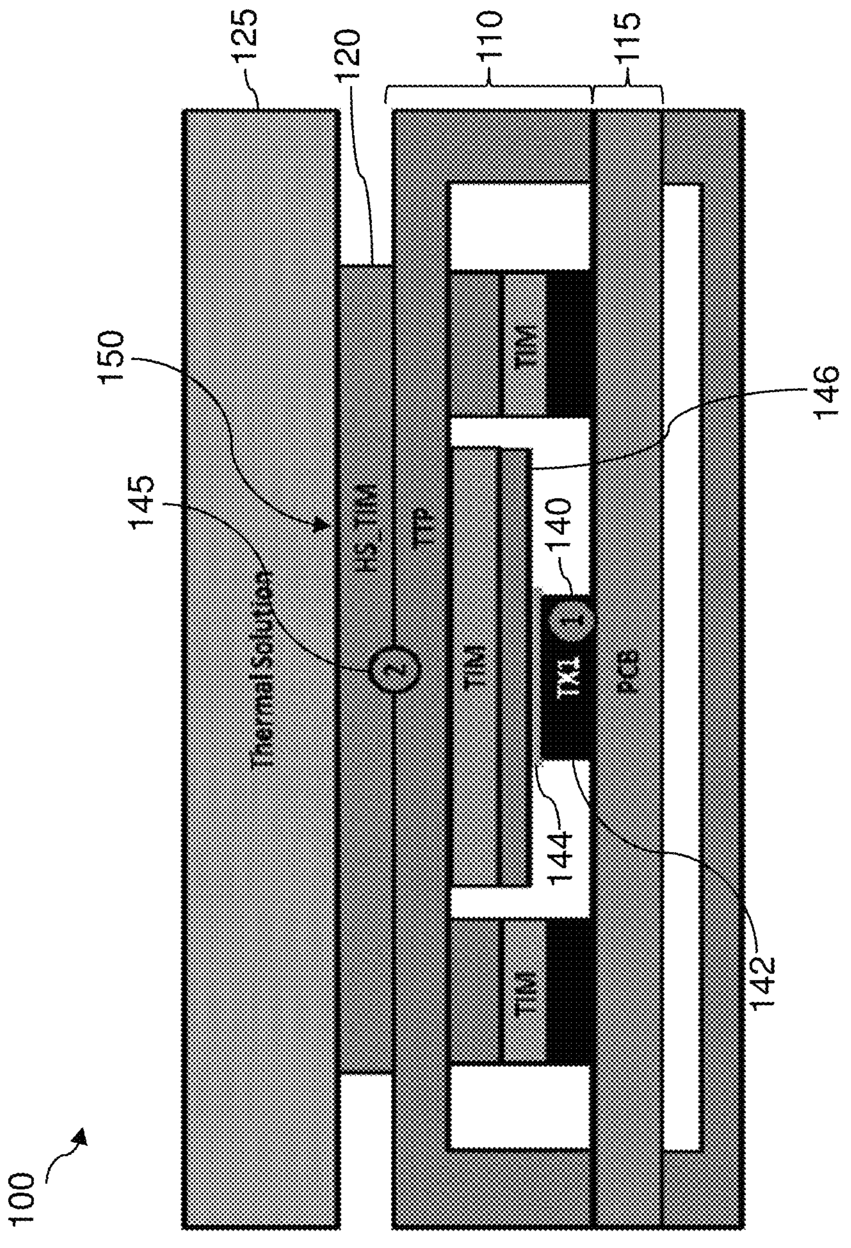
FIG. 1 is an illustration of a diagram of an example product thermal stack.

Turning now to the figures, FIG. 1 is an illustration of a diagram of an example product thermal stack 100. Product thermal stack 100 demonstrates some of the types of thermal interface layers and what the potential thermal failures could be at the thermal interface layer. Product thermal stack 100 demonstrates one type of thermal stack using multi-level thermal interface layers, denoted as TIMs in FIG. 1, which can be used with the disclosed processes. Product thermal stack 100 has a chip package 110 mounted on a printed circuit board (PCB) 115. The chip package 110 includes several thermal interface management layers, and a thermal transfer plate (TTP). On top of chip package 110, and connected via the TTP, is a high thermal interface management layer 120. Mounted to high thermal interface management layer 120 is a thermal solutions layer 125.

At a connection area 140, a chip 142 (TX1 which is mounted on a printed circuit board (PCB)) is thermally connected using a thermal interface layer 144 to a chip package LID 146. Thermal interface layer 144 could have a thermal failure, such as having a void or a problem with the thermal paste coverage. At a connection area 145, the thermal transfer plate (TTP) is thermally connected to high thermal interface management layer 120. High thermal interface management layer 120 (e.g., thermal interface layer) could have a thermal failure, such as having a loose screw, for example, on the thermal transfer plate. At a connection area 150, high thermal interface management layer 120 is thermally connected to thermal solutions layer 125 and could have a thermal failure due to an incorrectly connected fan or if the thermal material was not cured properly. These are examples of thermal failures, in practice, various combinations of these thermal failures can occur.

Thermal interface layer 144, high thermal interface management layer 120, and thermal solutions layer 125 can form a set of thermal interface layers. In other aspects, the set of thermal interface layers are the various thermal interface layers contained in the chip package or the board package. Typically, the set of thermal interface layers will include at least two thermal interface layers. In some aspects, the set of thermal interface layers are all of the thermal interface layers in the chip package or the board package. In some aspects, the set of thermal interface layers include at least two and less than all of the thermal interface layers in the chip package or the board package.

Thermal measurements, e.g., thermal testing, performing the disclosed processes, can occur at one or more stages of chip package testing. Thermal measurements can be conducted for the chip package, for example, during final testing, system level testing, board system testing, enclosure testing, client testing, or another testing point. The thermal failure can be better contained and corrected in the production cycle when the thermal failure can be identified earlier in the production and testing cycle.

Figure 2:
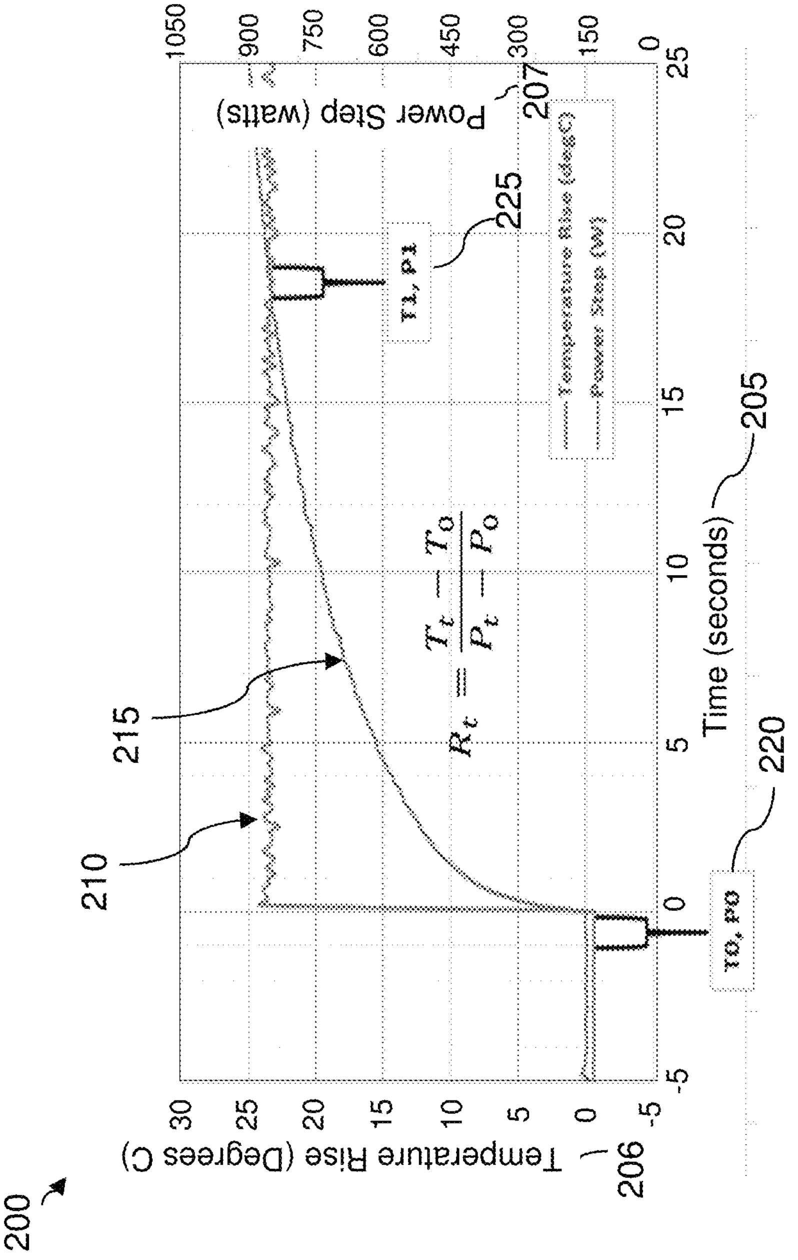
FIG. 2 is an illustration of a diagram of an example chart demonstrating the limitations of current testing processes.

FIG. 2 is an illustration of a diagram of an example chart 200 demonstrating the limitation of current testing processes. Chart 200 shows the relative temperature rise in a chip package relative to the increase in power applied to the chip. Chart 200 has an x-axis 205 showing the elapsed time in seconds, a y-axis 206 showing the temperature rise in Celsius, and a y-axis 207 showing a relative increase in watts supplied to the chip package.

A curve 210 shows the watts supplied to the chip package. A curve 215 shows the relative increase in heat generation over time at the maximum watts supplied to the chip package. A range 220 shows that at time equals 0 seconds and power $step_0$, the relative temperature is also near zero. A range 225 shows a time when the relative temperature increases crossing the watts supplied to the chip package. Chart 200 is calibrated so that range 225 indicates a time of the beginning of the excessive temperature of the chip package. Excessive temperature can reduce the efficiency of the chip package or cause damage to the chip package. Current testing methods can detect this thermal failure while not being able to determine from where the thermal failure is originating, e.g., from which thermal interface layer.

Figure 3:
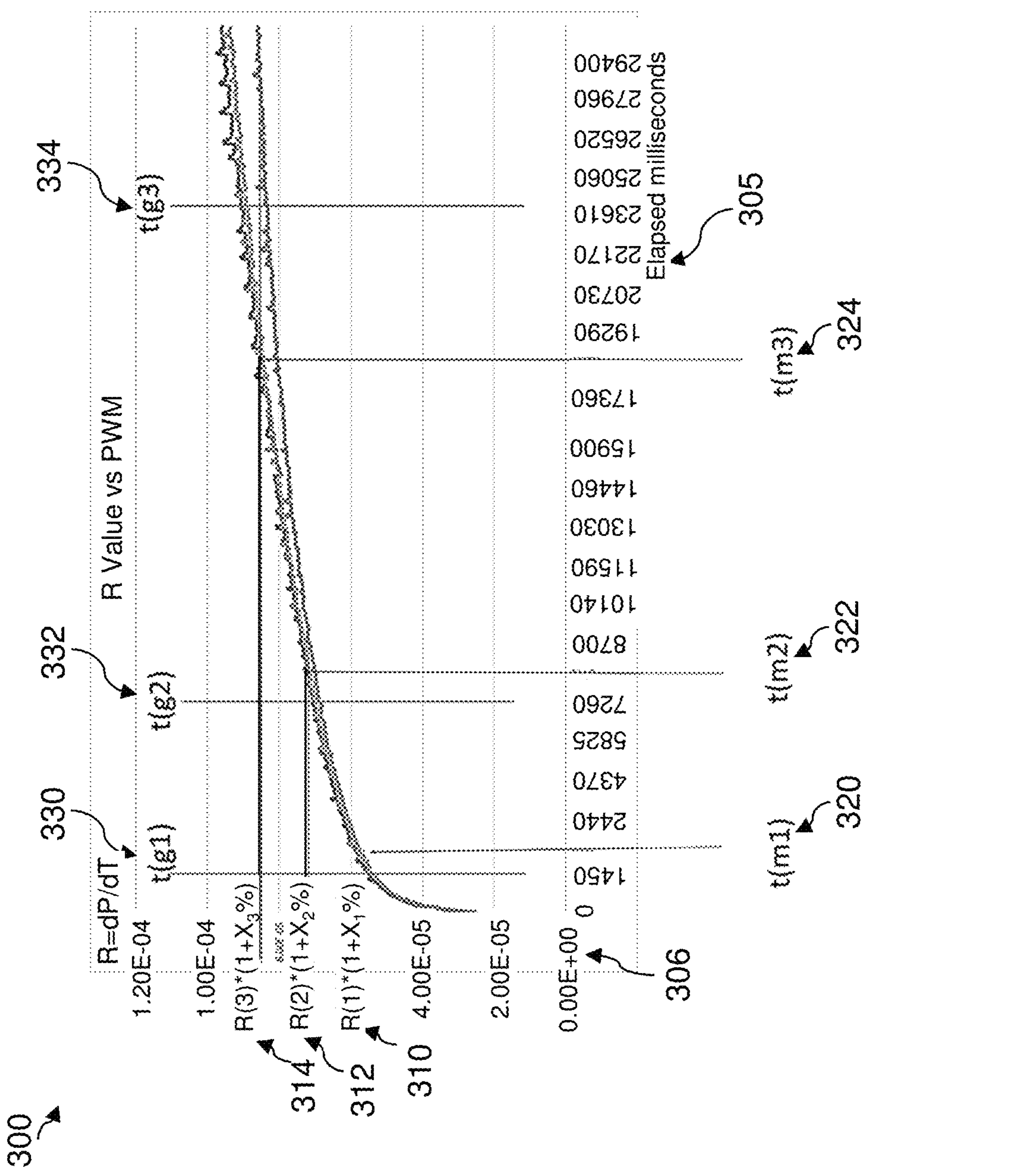
FIG. 3 is an illustration of a diagram of an example chart showing the disclosed process applied to the thermal analysis.

FIG. 3 is an illustration of a diagram of an example chart 300 showing the disclosed process applied to the thermal analysis. Chart 300 shows how the R deviation percentage thresholds can be adjusted to determine the thermal interface layer being measured. The R deviation $$R = \frac{dP}{dT},$$

where P is the power in watts and T is the time in seconds.

The disclosed process represents an algorithm to determine the R deviation percentage threshold for each thermal interface layer, represented by X %. The R deviation percentage can be calculated by using three steps. The first step can be to use a known good board to collect thermal resistance data which will follow a normal distribution of collected data. The second step can be to use a known bad board (a board that fails thermal testing) to collect thermal resistance data that is classified as outlier data elements. The third step can utilize a 3 or 4-sigma threshold to determine the threshold between the normal distribution data elements and the outlier data elements. Other sigma thresholds can be used, such as 1, 2, or 5-sigma.

The threshold percentage is greater than the measurement of the noise level, represented by a noise-level percentage (noise-level %). Therefore, X %>noise-level %. The threshold percentage is then used to determine a fixed value for each thermal interface layer, i.e., fixed value=R*(1+X %). When a measured R deviation is received, e.g., R>R(n=1 to the number of thermal layer interfaces), then the result is t(measured n=1 to the number of thermal interface layers), where t(n) is larger than the golden value. For example, before testing, a machine timestamp "a" can be received.

Then Rmeasured>R(n=1, 2, 3) can be received and recorded using a machine timestamp "b". Then t(measured n=1, 2, 3)=b−a.

The golden value is the measurement taken from a known good system and can be presented by t(gold n=1 to the number of thermal interface layers). Combining these derivations leads to the algorithm of the thermal interface layer (n) passes the thermal testing while t(measured n)>t(gold n). This disclosure determines an analysis point for each thermal interface layer being tested, rather than the conventional methodology which has one analysis point for the thermal interface layers combined. The disclosure allows the analysis to isolate which thermal interface layer is causing the thermal failure and can prevent a thermal shutdown of the chip or board package.

Chart 300 plots an example of the disclosed algorithm using three thermal interface layers. Chart 300 has an x-axis 305 showing the elapsed time in milliseconds and a y-axis 306 showing the change in power over time $$\left(R = \frac{dP}{dT}\right).$$

The R deviation percentage threshold for the first thermal interface layer is R(1) 310. The R deviation percentage threshold for the second thermal interface layer is R(2) 312. The R deviation percentage threshold for the third thermal interface layer is R(3) 314. The measured time (represented by a measured time parameter) as received from the thermal testing process is represented for each thermal interface layer. The first thermal interface layer has a measured time of t(m1) 320. The second thermal interface layer has a measured time of t(m2) 322. The third thermal interface layer has a measured time of t(m3) 324.

The first thermal interface layer has a gold value represented by t(g1) 330. The second thermal interface layer has a gold value represented by t(g2) 332. The third thermal interface layer has a gold value represented by t(g3) 334. Chart 300 demonstrates that t(m1)>t(g1) therefore the first thermal interface layer passes the thermal testing, t(m2)>t(g2) therefore the second thermal interface layer passes the thermal testing, t(m3)<t(g3) therefore the third thermal interface layer fails the thermal testing.

A thermal shutdown event can occur when the temperature T>T(shutdown temperature). In this analysis, temperature T at zero milliseconds, and power at zero milliseconds and power at time t are approximately constant. Therefore, R at any given elapsed millisecond time t is strongly correlated to Temperature T at time t, as shown in Equation 1. Using this relationship, the thermal testing can stop when the $R_t$ value reaches R(n=number of thermal interface layers)(1+$X_n$ %), where each thermal layer can have its own threshold ($X_n$) according to the data analysis.

Example correlation of R to temperature and power supplied to the package $$R_t = \frac{T_t - T_0}{P_t - P_0} \qquad \text{Equation 1}$$

Figure 4:
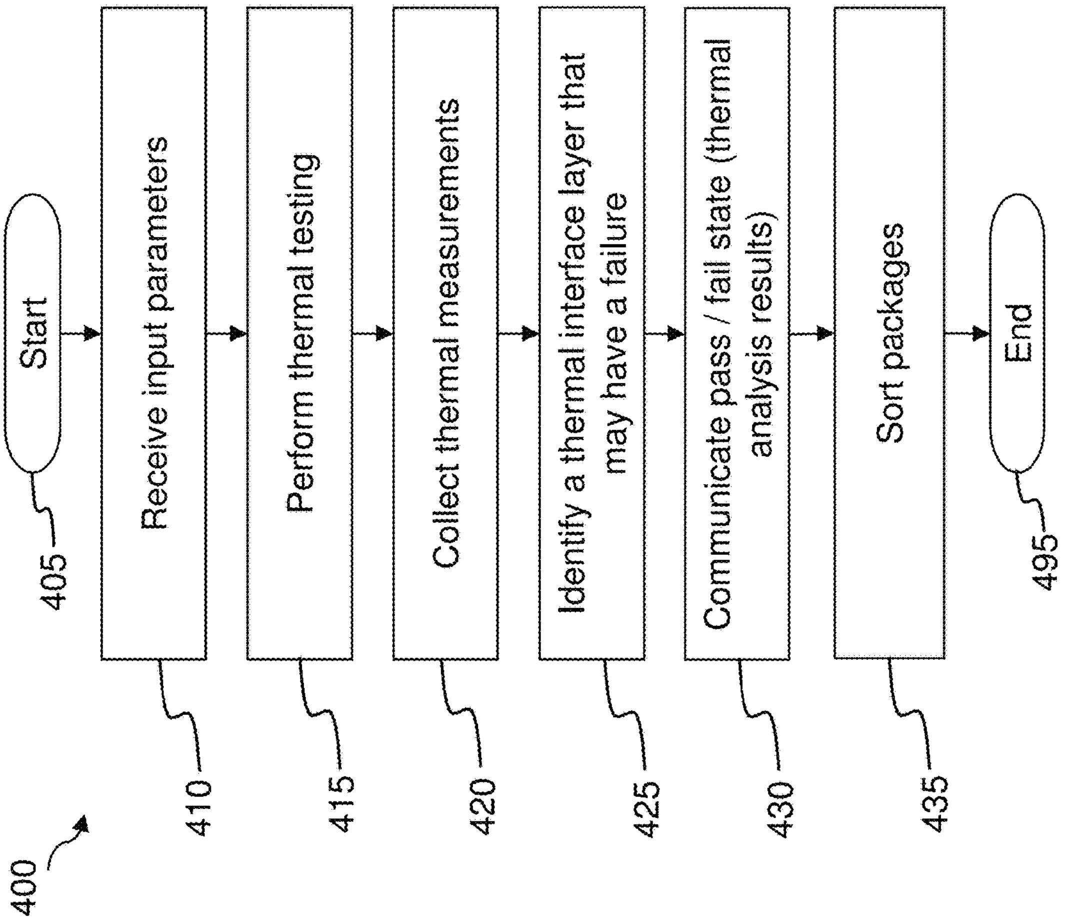
FIG. 4 is an illustration of a flow diagram of an example method for analyzing thermal testing measurements.

FIG. 4 is an illustration of a flow diagram of an example method 400 for analyzing thermal testing measurements. Method 400 can be performed on a computing system, for example, thermal testing system 500 of FIG. 5 or thermal testing controller 600 of FIG. 6. The computing system can be one or more processors in various combinations (e.g., CPUs, GPUs, SIMDs, or other types of processors), a data center, a cloud environment, a server, a laptop, a mobile device, a smartphone, a PDA, or other computing system capable of receiving the thread requests, and capable of executing threads in parallel. Method 400 can be encapsulated in software code or in hardware, for example, an application, code library, code module, dynamic link library, module, function, RAM, ROM module, and other software and hardware implementations. The software can be stored in a file, database, or other computing system storage mechanism. Method 400 can be partially implemented in software and partially in hardware. Method 400 can perform the steps for the described processes, for example, identifying a thermal interface layer that has failed within a chip or board package and directing or sorting the chip or board package according to the thermal failure state. DO ONE OR MORE STEPS OF METHOD 400 CORRESPOND TO THE ALGORITHM REPRESENTED BY FIG. 3? IS THERE ANY CORRESPONDENCE BETWEEN FIG. 4 AND FIG. 3?

Method 400 starts at a step 405 and proceeds to a step 410. In step 410, input parameters can be received. Input parameters can include gold values for each of the thermal interface layers, the amount of power to be supplied to the chip or board package, a time interval for ramping up the power, a time interval for conducting thermal testing, or other input parameters.

In a step 415, thermal testing can be performed. Testing can be performed by a testing jig, a manufacturing machine, or other types of systems that are capable of supplying power to the package and measuring the thermal characteristics of the package. In a step 420, the thermal measurements can be collected over the power ramp-up time interval or over the testing time interval. In some aspects, the thermal measurements can be communicated to one or more other systems, for example, a manufacturing controller, a testing controller, a data center, or a cloud environment.

In a step 425, at least one thermal interface layer that may have a failure is identified. In step 425, individual thermal interface layers, such as each thermal interface layer, can be analyzed against its respective gold value using the disclosed algorithm. The thermal measurements are separated into the measurements that correspond to each thermal interface layer and when compared to the respective gold value can identify whether that thermal interface layer has passed or failed the thermal testing (e.g., pass/fail state). The pass/fail state can be incorporated into a thermal failure parameter for each thermal interface layer, forming a set of thermal failure parameters.

In a step 430, the results can be communicated to one or more other systems, where the results can be the thermal analysis, the pass/fail state for each thermal interface layer, or the set of thermal failure parameters. For example, a testing jig can communicate the results to a package sorter so the tested package can be sorted into the correct designated group for further handling. In some aspects, the results can be communicated to a manufacturing system to alert the system or users that a manufacturing process may need to be updated (e.g., a manufacturing process change), or that a specific manufacturing machine may need repair, cleaning, or modification (e.g., initiate a maintenance process or a manufacturing maintenance operation).

In a step 435, the chip or board package can be sorted into a designated group for further handling. For example, a group can be designated for when each thermal interface layer passes, another group can be designated for packages when a thermal interface layer fails and the package continues to a customer with a recommendation on reduced power usage, another group can be designated for packages when a thermal interface layer fails and are repairable, and another group can be designated for packages when a thermal interface layer fails and it is not a repairable type. There can be additional groups with various combinations of designations. Method 400 ends at a step 495.

Figure 5:
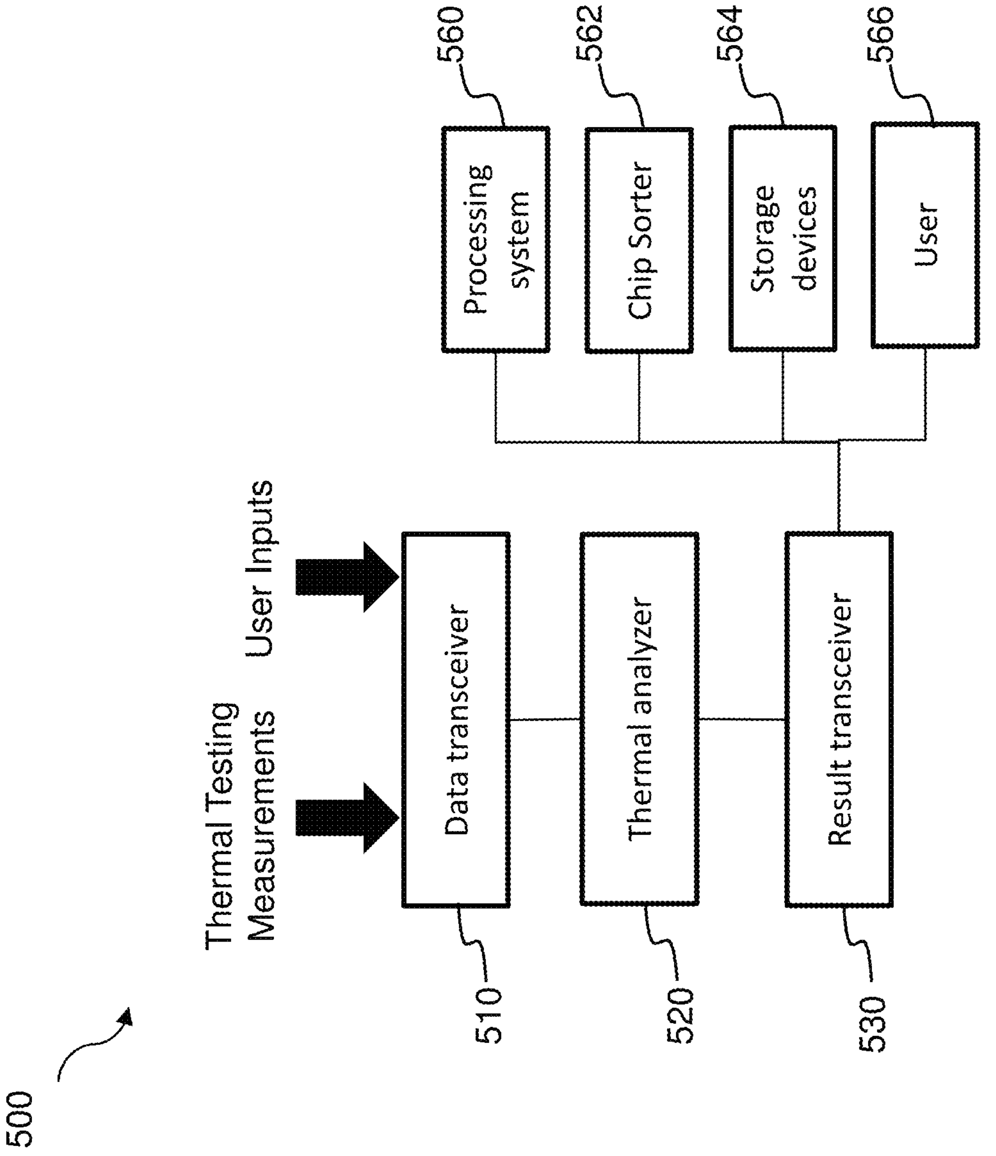
FIG. 5 is an illustration of a block diagram of an example thermal testing system.

FIG. 5 is an illustration of a block diagram of an example thermal testing system 500. Thermal testing system 500 can be implemented in one or more computing systems or one or more processors. In some aspects, thermal testing system 500 can be implemented using a thermal testing controller such as thermal testing controller 600 of FIG. 6. Thermal testing system 500 can implement one or more aspects of this disclosure, such as method 400 of FIG. 4.

Thermal testing system 500, or a portion thereof, can be implemented as an application, a code library, a dynamic link library, a function, a module, a header file, other software implementation, or combinations thereof. In some aspects, thermal testing system 500 can be implemented in hardware, such as a ROM, a graphics processing unit, or other hardware implementation. In some aspects, thermal testing system 500 can be implemented partially as a software application and partially as a hardware implementation. Thermal testing system 500 is a functional view of the disclosed processes and an implementation can combine or separate the described functions in one or more software or hardware systems.

Thermal testing system 500 includes a data transceiver 510, a thermal analyzer 520, and a result transceiver 530. The output, e.g., the thermal analysis for a chip or board package from thermal analyzer 520, can be communicated to a data receiver, such as one or more of a processing system 560 (one or more combinations of processors or processing cores), package sorter 562, one or more storage devices 564, or one or more users 566. The output can be used to provide a recommendation to a system on which thermal interface layer a failure may have occurred.

For example, package sorter 562 can use the thermal analysis results to determine which group the chip or board should be placed in. Packages that pass all thermal interface layers can be placed in one or more groups, while packages that fail can be sorted into different groups. Sorting can be further specified into groups where the identified thermal interface layer can be repaired and where the identified thermal interface layer may not be able to be repaired.

In some aspects, the results of the thermal analysis, such as those communicated to the one or more processing systems 560, one or more storage devices 564, or one or more users 566, can be used as an input into a manufacturing system. The manufacturing process can be updated using the thermal analysis results to decrease the potential failure of the thermal interface layer. For example, additional or less material can be applied to a thermal interface layer or the torque applied to a screw can be modified. In some aspects, the results of the thermal analysis can be used to identify a manufacturing system that needs repair or modification (e.g., maintenance). For example, if one manufacturing machine has more thermal failures at a specific thermal interface layer than other manufacturing machines, then that one manufacturing machine can be identified as needing repair, cleaning, or modification.

Data transceiver 510 can receive the thermal measurements, as well as operational parameters (e.g., input parameters), such as the power to be supplied to the package, the gold values for each thermal interface layer, a time interval for conducting the testing, or other input or operational parameters. In some aspects, data transceiver 510 can be part of thermal analyzer 520.

Result transceiver 530 can communicate one or more outputs, to one or more data receivers, such as processing systems 560, package sorters 562, storage devices 564, users 566, or other related systems, whether located proximate result transceiver 530 or distant from result transceiver 530. Data transceiver 510, thermal analyzer 520, and result transceiver 530 can be, or can include, conventional interfaces configured for transmitting and receiving data. Data transceiver 510, thermal analyzer 520, or result transceiver 530 can be implemented as software components, for example, a virtual processor environment, as hardware, for example, circuits of an integrated circuit, or combinations of software and hardware components and functionality. The functionality described for these components remains intact regardless of how the functionality is implemented.

Thermal analyzer 520 (e.g., one or more processors such as processor 630 of FIG. 6) can implement the analysis and algorithms as described herein utilizing the input parameters and thermal measurements. Thermal analyzer 520 can be one or more of a multicore processor, a multiprocessor system, or a streaming multiprocessor. Thermal analyzer 520 can be implemented by a central processing unit (CPU), a graphics processing unit (GPU), or other types of processors.

A memory or data storage system of thermal analyzer 520 (such as a core cache, L1 cache, L2 cache, or other memory systems) can be configured to store the processes and algorithms for directing the operation of thermal analyzer 520. Thermal analyzer 520 can include a processor that is configured to operate according to the analysis operations and algorithms disclosed herein, and an interface to communicate (transmit and receive) data.

Figure 6:
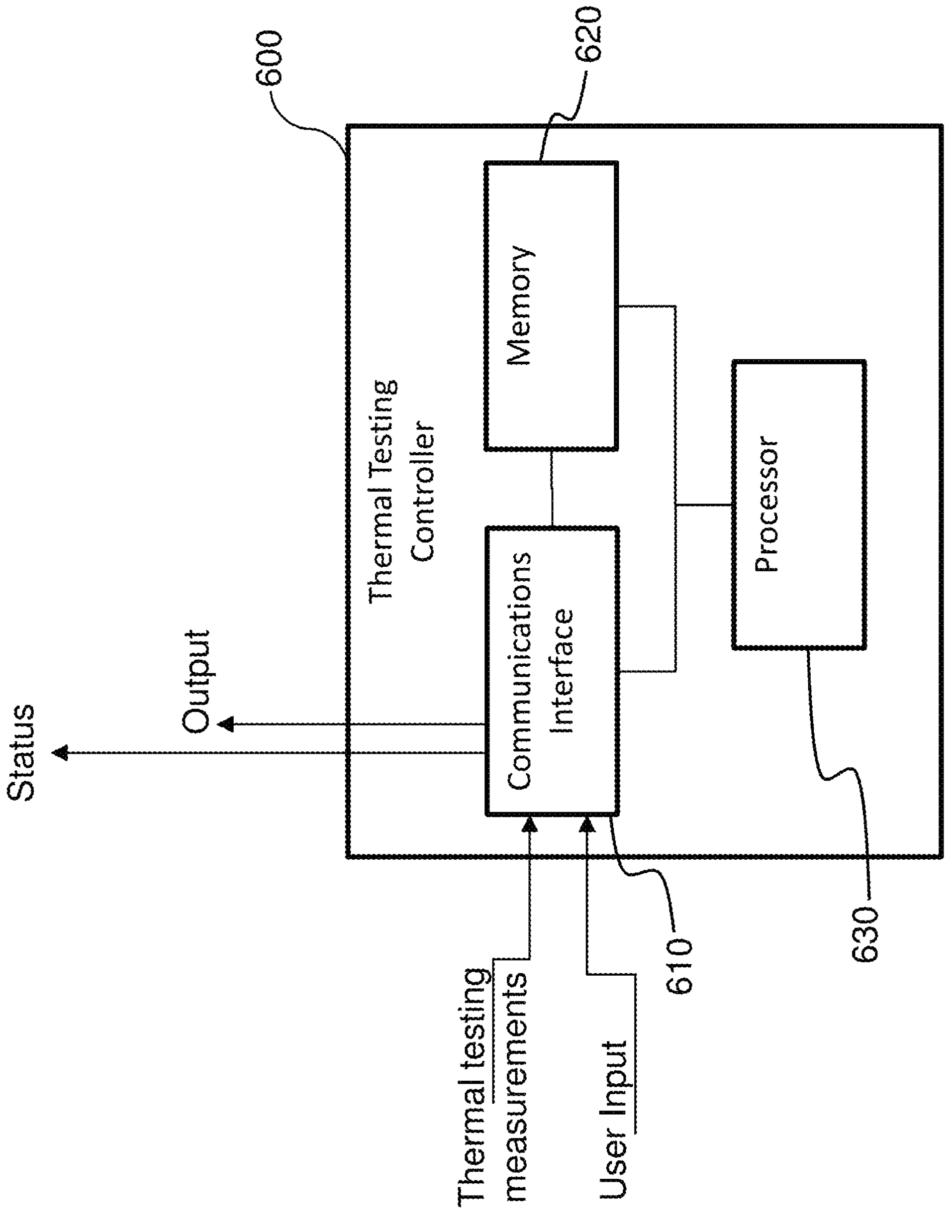
FIG. 6 is an illustration of a block diagram of an example of a thermal testing controller 600 according to the principles of the disclosure.

FIG. 6 is an illustration of a block diagram of an example of a thermal testing controller 600 according to the principles of the disclosure. Thermal testing controller 600 can be stored on one computer or multiple computers. The various components of thermal testing controller 600 can communicate via wireless or wired conventional connections. A portion or a whole of thermal testing controller 600 can be located at one or more locations. In some aspects, thermal testing controller 600 can be part of another system (e.g., processor, core, server, or other systems), and can be integrated with one device, such as a part of a processing system. Thermal testing controller 600 represents a demonstration of the functionality employed for the disclosure, and implementations can use a variety of devices, for example, circuits of a processor, dedicated processors, virtual systems, servers, other computing or processing systems, be in software or hardware, or various combinations thereof.

Thermal testing controller 600 can be configured to perform the various functions disclosed herein including receiving input parameters and generating results from execution of the methods and processes described herein, such as determining a thermal interface layer that is failing a thermal test. Thermal testing controller 600 includes a communications interface 610, a memory 620, and a processor 630.

Communications interface 610 is configured to transmit and receive data. For example, communications interface 610 can receive the input parameters and thermal testing measurements. Communications interface 610 can transmit the output or interim outputs. In some aspects, communications interface 610 can transmit a status, such as a success or failure indicator of thermal testing controller 600 regarding receiving the various inputs, transmitting the generated outputs, or producing the results.

In some aspects, processor 630 can perform the operations as described by thermal analyzer 520. Communications interface 610 can communicate via communication systems used in the industry. For example, wireless or wired protocols can be used. Communication interface 610 is capable of performing the operations as described for data transceiver 510 and result transceiver 530 of FIG. 5.

Memory 620 can be configured to store a series of operating instructions that direct the operation of processor 630 when initiated, including supporting code representing the algorithm for analyzing the thermal testing measurements to determine which, if any, thermal interface layer is failing the thermal test. Memory 620 is a non-transitory computer-readable medium. Multiple types of memory can be used for the data storage systems and memory 620 can be distributed.

Processor 630 can be one or more processors. Processor 630 can be a combination of processor types, such as a CPU, a GPU, a single instruction multiple data (SIMD) processor, or other processor types. Processor 630 can be configured to produce the output, one or more interim outputs, and statuses utilizing the received inputs. Processor 630 can determine the output using parallel processing. Processor 630 can be an integrated circuit. In some aspects, processor 630, communications interface 610, memory 620, or various combinations thereof, can be an integrated circuit. Processor 630 can be configured to direct the operation of thermal testing controller 600. Processor 630 includes the logic to communicate with communications interface 610 and memory 620, and perform the functions described herein. Processor 630 is capable of performing or directing the operations as described by thermal analyzer 520 of FIG. 5.

For example, in some aspects, thermal testing system 500 or thermal testing controller 600 can be part of a testing jig that at least performs a thermal test on a chip package or a board package by supplying power to the chip package or board package and collecting thermal measurements over a time interval. In some aspects, thermal testing system 500 or thermal testing controller 600 can be part of another system that receives thermal measurements from a testing system. For example, in some aspects, thermal testing system 500 or thermal testing controller 600 can be part of a manufacturing system, a warehouse floor system, or be located in a data center, a cloud system, an edge system, a corporate system, or other type of system or location. In some aspects, the thermal measurements can be received from a data store, such as a database or a server.

In some aspects, thermal testing system 500 or thermal testing controller 600 can be part of a machine learning system where the thermal measurements are used to train a machine learning model and the machine learning model is used to improve the analysis results by the disclosed processes.

This testing can be performed at various stages of handling the chip or board package, for example, at wafer manufacturing, at final testing, at system level testing, at user acceptance testing, at a customer's location, or at other times in the life cycle of the chip or board package. A chip package can be thermally tested before or after being mounted on a board package.

A portion of the above-described apparatus, systems or methods may be embodied in or performed by various digital data processors or computers, wherein the computers are programmed or store executable programs of sequences of software instructions to perform one or more of the steps of the methods. The software instructions of such programs may represent algorithms and be encoded in machine-executable form on non-transitory digital data storage media, e.g., magnetic or optical disks, random-access memory (RAM), magnetic hard disks, flash memories, and/or read-only memory (ROM), to enable various types of digital data processors or computers to perform one, multiple or all of the steps of one or more of the above-described methods, or functions, systems or apparatuses described herein. The data storage media can be part of or associated with digital data processors or computers.

The digital data processors or computers can be comprised of one or more GPUs, one or more CPUs, one or more of other processor types, or a combination thereof. The digital data processors and computers can be located proximate to each other, proximate to a user, in a cloud environment, a data center, or located in a combination thereof. For example, some components can be located proximate to the user, and some components can be located in a cloud environment or data center.

The GPUs can be embodied on one semiconductor substrate, included in a system with one or more other devices such as additional GPUs, a memory, and a CPU. The GPUs may be included on a graphics card that includes one or more memory devices and is configured to interface with a motherboard of a computer. The GPUs may be integrated GPUs (iGPUs) that are co-located with a CPU on one chip. Configured or configured to means, for example, designed, constructed, or programmed, with the necessary logic and/or features for performing a task or tasks.

Portions of disclosed examples or embodiments may relate to computer storage products with a non-transitory computer-readable medium that have program code thereon for performing various computer-implemented operations that embody a part of an apparatus, device or carry out the steps of a method set forth herein. Non-transitory used herein refers to all computer-readable media except for transitory, propagating signals. Examples of non-transitory computer-readable media include, but are not limited to: magnetic media such as hard disks, floppy disks, and magnetic tape; optical media such as CD-ROM disks; magneto-optical media such as floppy disks; and hardware devices that are specially configured to store and execute program code, such as ROM and RAM devices. Examples of program code include both machine code, such as produced by a compiler, and files containing higher level code that may be executed by the computer using an interpreter.

In interpreting the disclosure, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

Those skilled in the art to which this application relates will appreciate that other and further additions, deletions, substitutions, and modifications may be made to the described embodiments. It is also to be understood that the terminology used herein is for the purpose of describing particular embodiments only, and is not intended to be limiting, since the scope of the present disclosure will be limited only by the claims. Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the present disclosure, a limited number of the exemplary methods and materials are described herein.

Each of the aspects disclosed in the SUMMARY can have one or more of the following additional elements in combination. Element 1: wherein the determining the measured time parameter further comprises receiving measurements of thermal testing from a testing jig. Element 2: wherein the testing jig supplies power to the chip package or the board package. Element 3: where an amount of power is determined by an input parameter. Element 4: wherein the R deviation percentage threshold is greater than a noise-level percentage for each respective thermal interface layer. Element 5: wherein the calculating the R deviation utilizes an algorithm of R deviation equals R multiplied by (one plus the R deviation percentage threshold). Element 6: wherein the thermal failure parameter represents a failure state when the measured time parameter for a respective thermal interface layer is less than the thermal interface layer gold value for that respective thermal interface layer. Element 7: wherein the set of thermal interface layers is at least two thermal interface layers. Element 8: wherein a package sorter receives the set of thermal failure parameters and directs the chip package or the board package to a designated group. Element 9: wherein a manufacturing controller receives the set of thermal failure parameters and initiates a maintenance process to correct manufacturing of at least one thermal interface layer in the set of thermal interface layers using the set of thermal failure parameters. Element 10: wherein the set of thermal failure parameters is used to improve a manufacturing process of the chip package or the board package. Element 11: further comprising a testing jig, operational to communicate with the thermal analyzer and to collect the input measurements of the thermal testing. Element 12: wherein the input parameters are one or more of a respective gold value for each thermal interface layer or an amount of power to be supplied to the chip package or the board package. Element 13: further comprising a transceiver, operational to communicate the set of thermal failure parameters to a package sorter. Element 14: further comprising a manufacturing controller, operational to initiate or issue an alert for a manufacturing process change or a manufacturing maintenance operation.

What is claimed is:

1. A method, comprising:

determining an R deviation percentage threshold for each thermal interface layer in a set of thermal interface layers, wherein the set of thermal interface layers is part of a chip package or a board package undergoing a thermal test;

calculating an R deviation for each thermal interface layer in the set of thermal interface layers using the R deviation percentage threshold, wherein the R deviation is an integral of the change in power over a time interval;

obtaining thermal measurements from a testing jig that supplies power to the chip package or the board package and measures thermal characteristics over a time interval;

determining a measured time parameter from the R deviation and the thermal measurements from the chip package or the board package for each thermal interface layer in the set of thermal interface layers;

identifying at least one thermal failure parameter for at least one thermal interface layer in the set of thermal interface layers by comparing the measured time parameter to a thermal interface layer gold value for each respective thermal interface layer; and moving, by a package sorter using the at least one thermal failure parameter, the chip package or the board package to a designated place, wherein the chip package or the board package that passes each thermal interface layer test is placed in a first group, the chip package or the board package that fails at least one thermal interface layer test and is repairable is placed in a second group, and the chip package or the board package that fails at least one thermal interface layer test and is not repairable is placed in a third group.

2. The method as recited in claim 1, further comprising:

modifying a torque applied to a fastening mechanism associated with a respective thermal interface layer indicated as failing by the at least one thermal failure parameter.

3. The method as recited in claim 2, wherein an amount of power supplied by the testing jig is determined by an input parameter.

4. The method as recited in claim 1, wherein the R deviation percentage threshold is greater than a noise-level percentage for each respective thermal interface layer.

5. The method as recited in claim 1, wherein the calculating the R deviation utilizes an algorithm of R deviation equals R multiplied by (one plus the R deviation percentage threshold).

6. The method as recited in claim 1, wherein the thermal failure parameter represents a failure state when the measured time parameter for a respective thermal interface layer is less than the thermal interface layer gold value for that respective thermal interface layer.

7. The method as recited in claim 1, wherein the set of thermal interface layers is at least two thermal interface layers.

8. The method as recited in claim 1, further comprising:

initiating a maintenance operation on a specific manufacturing machine identified as needing maintenance when the at least one thermal failure parameter indicates that the specific manufacturing machine has more thermal failures at a specific thermal interface layer than other manufacturing machines.

9. The method as recited in claim 1, further comprising:

modifying, by a manufacturer controller, at least one manufacturing parameter associated with a respective thermal interface layer identified as failing by the at least one thermal failure parameter.

10. The method as recited in claim 9, further comprising:

adjusting, using the at least one manufacturing parameter, an amount of thermal interface material applied to a respective thermal interface layer.

11. A system, comprising:

a receiver, operational to receive input parameters and input measurements from thermal testing of a chip package or a board package; and a thermal analyzer, implemented on one or more processors, and operational to determine an R deviation percentage threshold for each thermal interface layer in a set of thermal interface layers, calculate an R deviation for each thermal interface layer using the R deviation percentage threshold, determine a measured time parameter from the R deviation and the input measurements from the thermal testing for each thermal interface layer, identify a thermal failure parameter for each thermal interface layer by comparing the measured time parameter to a thermal interface layer gold value, and communicating the thermal failure parameter for each thermal interface layer as a set of thermal failure parameters, wherein the R deviation is an integral of the change in power over the measured time parameter.

12. The system as recited in claim 11, further comprising: a testing jig, operational to communicate with the thermal analyzer and to collect the input measurements of the thermal testing.

13. The system as recited in claim 11, wherein the input parameters are one or more of a respective gold value for each thermal interface layer or an amount of power to be supplied to the chip package or the board package.

14. The system as recited in claim 11, further comprising: a transceiver, operational to communicate the set of thermal failure parameters to a package sorter.

15. The system as recited in claim 11, further comprising: a manufacturing controller, operational to initiate or issue an alert for a manufacturing process change or a manufacturing maintenance operation.

16. A computer program product having a series of operating instructions stored on a non-transitory computer-readable medium that directs a data processing apparatus when executed thereby to perform operations to identify a set of thermal failure parameters, the operations comprising:

determining an R deviation percentage threshold for individual thermal interface layers in a set of thermal interface layers, wherein the set of thermal interface layers is part of a chip package or a board package undergoing a thermal test;

calculating an R deviation for the individual thermal interface layers in the set of thermal interface layers using the R deviation percentage threshold, wherein the R deviation is an integral of the change in power over a time interval;

obtaining thermal measurements from a testing jig that supplies power to the chip package or the board package and measures thermal characteristics over a time interval;

determining a measured time parameter from the R deviation and thermal measurements from the chip package or the board package for the individual thermal interface layers in the set of thermal interface layers; and identifying at least one thermal failure parameter for the individual thermal interface layers in the set of thermal interface layers by comparing the measured time parameter to a thermal interface layer gold value for each respective thermal interface layer in the set of thermal interface layers.

17. The computer program product recited in claim 16, wherein the R deviation percentage threshold is greater than a noise-level percentage for each respective thermal interface layer.

18. The computer program product as recited in claim 16, wherein the calculating the R deviation utilizes an algorithm of R deviation equals R multiplied by (one plus the R deviation percentage threshold).

19. The computer program product as recited in claim 16, wherein the thermal failure parameter represents a failure state when the measured time parameter for a respective thermal interface layer is less than the thermal interface layer gold value for that respective thermal interface layer.

20. The computer program product as recited in claim 16, wherein a testing jig supplies power to the chip package or the board package, where an amount of power is determined by an input parameter.

* * * * *